(12) United States Patent  (10) Patent No.: US 6,654,247 B1
Lee  (45) Date of Patent: Nov. 25, 2003

(54) COMPUTER HEAT DISSIPATING STRUCTURE

(75) Inventor: Kueir Lee, Taipei Hsien (TW)

(73) Assignee: Saint Song Corp., Taipei Hsien (TW)

( * ) Notice: Subject to any disclaimer, the term of this patent is extended or adjusted under 35 U.S.C. 154(b) by 0 days.

(21) Appl. No.: 10/262,974

(22) Filed: Oct. 3, 2002

(51) Int. Cl.[7] .................................................. H05K 7/20
(52) U.S. Cl. ...................... 361/697; 165/80.3; 165/121; 361/719; 454/184
(58) Field of Search ........................ 174/16.3; 454/184; 165/121–126, 185, 80.3; 257/718, 719, 722, 726, 727; 361/687, 695, 697, 698, 703, 704, 717–719

(56) References Cited

U.S. PATENT DOCUMENTS 6,529,375 B2 * 3/2003 Miyahara et al. ........... 361/697
6,567,269 B2 * 5/2003 Homer et al. ............... 361/700
2002/0181200 A1 * 12/2002 Chang
2003/0002254 A1 * 1/2003 Faneuf

* cited by examiner

Primary Examiner—Gerald Tolin
(74) Attorney, Agent, or Firm—Browdy and Neimark

(57) ABSTRACT

A computer heat dissipating structure of the invention is mounted over a computer main board inside a computer principal unit to dissipate the heat irradiated by at least a principal heat source and a secondary heat source. The computer heat dissipating structure comprises a heat sink that is mounted on the principal heat source, and a fan that is mounted at one lateral side of the heat sink. The fan includes an outer casing that has a lower casing body made of a material having good thermal conduction characteristics. The outer casing further includes an airflow inlet and an airflow outlet that is connected to the heat sink, the lower casing body being placed on the secondary heat source. Via a separate mount of the heat sink and the fan, a lateral blow vis-à-vis the heat sink is thereby achieved to improve the simultaneous heat dissipation of two heat sources.

10 Claims, 5 Drawing Sheets

COMPUTER HEAT DISSIPATING STRUCTURE

BACKGROUND OF THE INVENTION

1. Field of the Invention

The invention relates to a computer heat dissipating structure. More particularly, the invention provides a computer heat dissipating structure. that comprises a lateral blow type fan that is separately mounted in respect of a heat sink to simultaneously dissipate the heat produced by at least two heat sources.

2. Description of the Related Art

As the computer industry advances, the central processor unit (CPU) and the chipsets become increasingly faster. This results in an amount of produced heat that is substantially higher. To maintain the CPU and the chipsets under an acceptable temperature of operation, a heat sink is conventionally mounted to dissipate heat.

The heat sink of the prior art is formed principally via aluminum extrusion, pouring molding, or folding. The fabrication of a heat sink by aluminum extrusion or pouring molding is usually constrained by a subsequent mechanical machining process, which therefore limits its thermal dissipation density (defined as the general heat dissipating sur face area per volume unit). As a result, to dissipate a greater amount of heat, the dimensional volume and the weight of the heat sink are increased. On the other hand, a heat sink of the prior art formed by folding is usually obtained via successively stacking a plurality of metallic foil in the shape of fins. The resulting thermal dissipation density is relatively higher, which therefore provides a better thermal dissipation performance. Moreover, the dimensional volume and the weight of the heat sink are reduced compared to a heat sink formed by aluminum extrusion or pouring molding.

To further improve the performance of the heat sink, the mount of a fan is also known in the prior art. The fan is usually fastened on the heat sink and, when driven in rotation, produces a cooling airflow downward to the heat sink, which enhances the heat convection of the heat sink.

Referring to FIG. 1, a schematic view illustrates a heat dissipating structure of the prior art comprising a heat sink 10a and a fan 20a. The heat sink 10a is made of copper or aluminum. The heat sink 10a has a body 11a to which are connected a plurality of fins 12a. A bottom of the body 11a is attached on the CPU 30a to dissipate heat.

The fan 20a is attached on the heat sink 10a via a screw 21a. When the fan 20a rotates, it produces a cooling airflow downward to the heat sink 10a to promote the heat dissipation.

Because the fan of the above heat dissipating structure produces a downward airflow, a resulting air pressure is relatively high, which impedes a rapid heat dissipation.

Furthermore, the effects of the above heat dissipating structure apply only to one single heat source. In a computer principal unit, the CPU however operates in cooperation with other chipsets such as the north bridge chipset, which are also heat sources that may undesirably increase the temperature of the principal unit. To dissipate the heat produced by these other heat sources, other heat dissipating structures, constructed as above, are therefore needed, which increases the production cost and requires a larger mounting space.

Another disadvantage of the above heat dissipating structure of the prior art is that it is relatively higher in size, which may be incompatible with certain computer structures that are dimensionally limited.

Furthermore, the fan of the above heat dissipating structure generally produces a downward airflow that, carrying the heat, substantially remains within the computer principal unit. As a result, the beneficial effects of fan are limited. If the fan is continuously operated, it may causes a substantial consumption of power.

SUMMARY OF THE INVENTION

It is therefore a principal object of the invention to provide a computer heat dissipating structure that comprises a lateral blow type fan, which creates a relatively lower air pressure so as to enable a rapid heat dissipation and increase the heat dissipation performance.

It is another object of the invention to provide a computer heat dissipating structure that implements a separate mount structure so as to dissipate at the same time the heat irradiated from at least two heat sources, without increasing the production cost and the mounting space.

Furthermore, it is another object of the invention to provide a computer heat dissipating structure wherein the fan is mounted at a lateral side of the heat sink so as to reduce the dimensional height of the whole structure. As a result, the computer heat dissipating structure is compatible with computer structures that are dimensionally limited.

Yet, it is another object of the invention to provide a computer heat dissipating structure that can effectively conduct the airflow carrying the heat out of the computer principal unit and thereby improves the heat dissipation performance.

To accomplish the above and other objectives, a computer heat dissipating structure of the invention is mounted over a computer main board inside a computer principal unit to dissipate the heat irradiated by at least a principal heat source and a secondary heat source. The computer heat dissipating structure comprises a heat sink that is mounted on the principal heat source, and a fan that is mounted at one lateral side of the heat sink. The fan includes an outer casing that has a lower casing body made of a material having good thermal conduction characteristics. The outer casing further includes an airflow inlet and an airflow outlet that is connected to the heat sink, the lower casing body being placed on the secondary heat source.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
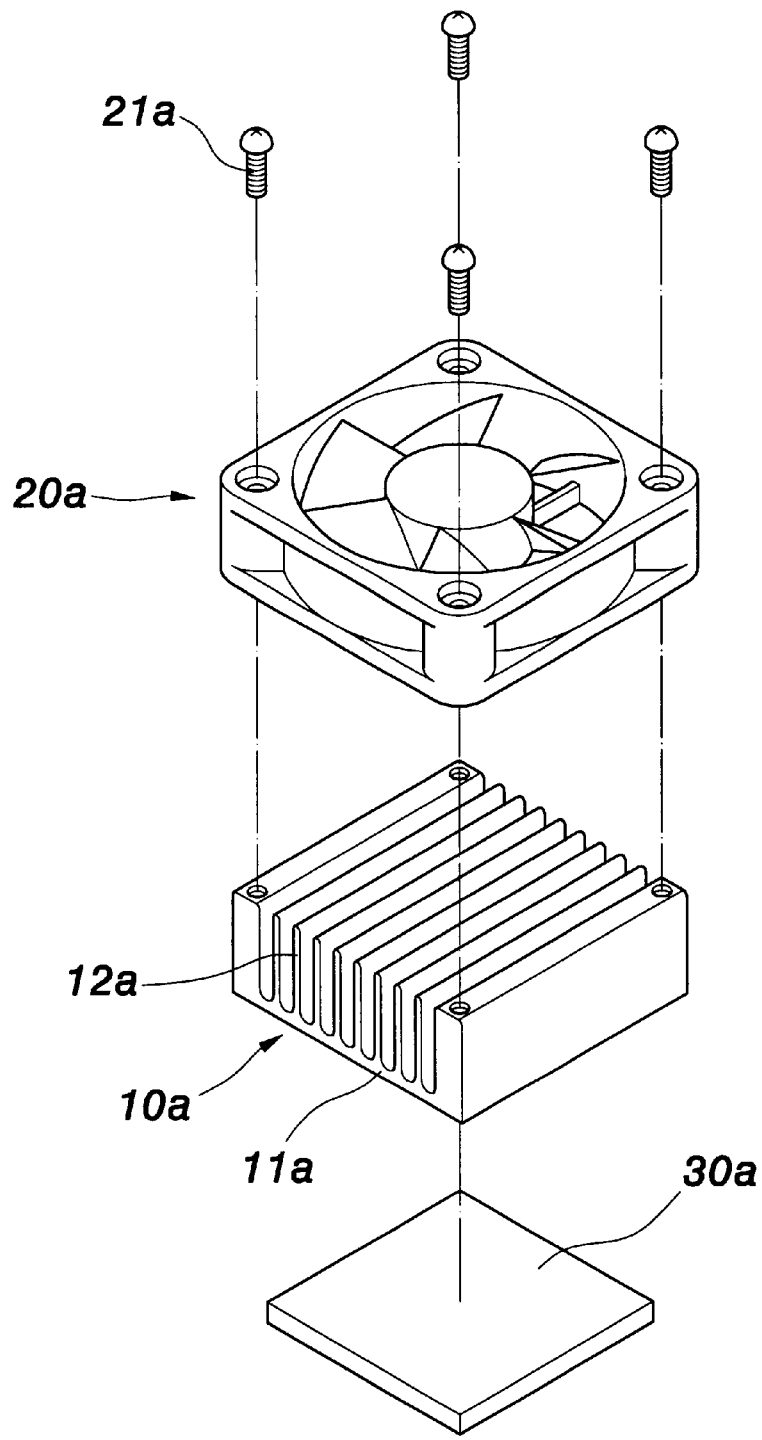
FIG. 1 is an exploded view of a computer heat dissipating structure known in the prior art.
Figure 2:
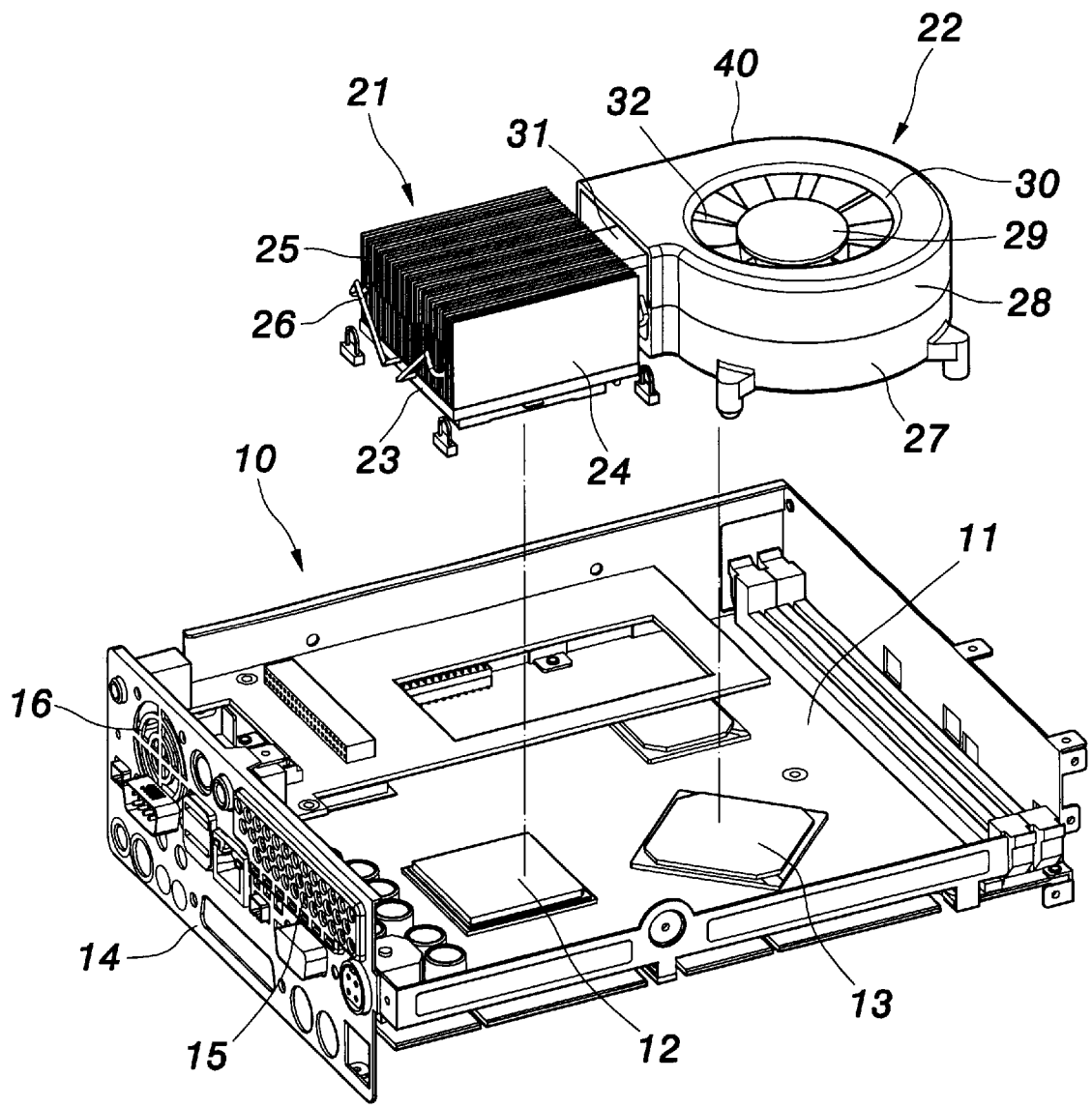
FIG. 2 is an exploded view of a computer heat dissipating structure according to an embodiment of the invention.

Wherever possible in the following description, like reference numerals will refer to like elements and parts unless otherwise illustrated.

Figure 3:
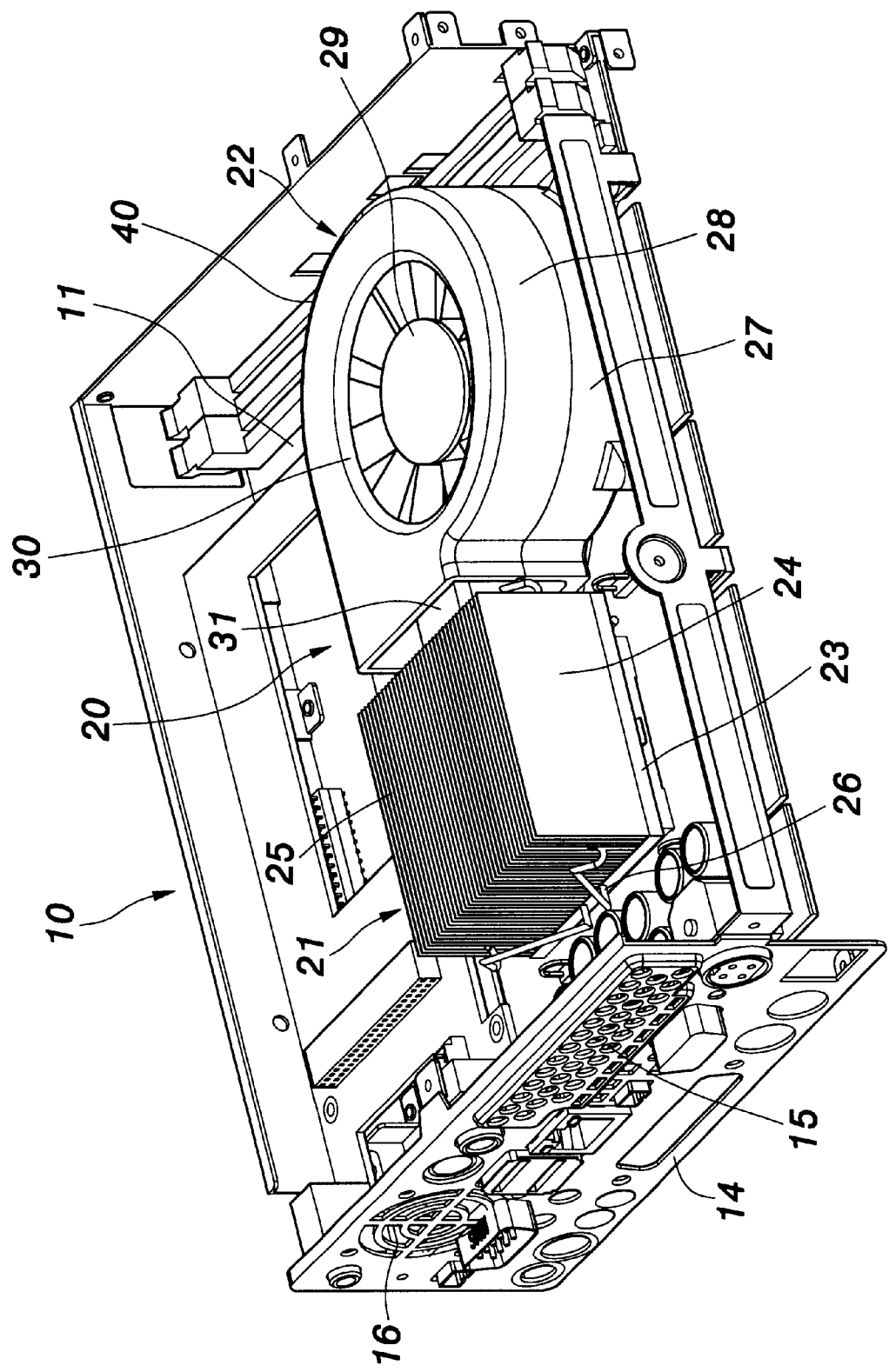
FIG. 3 is a perspective view of an assembled computer heat dissipating structure according to an embodiment of the invention.
Figure 4:
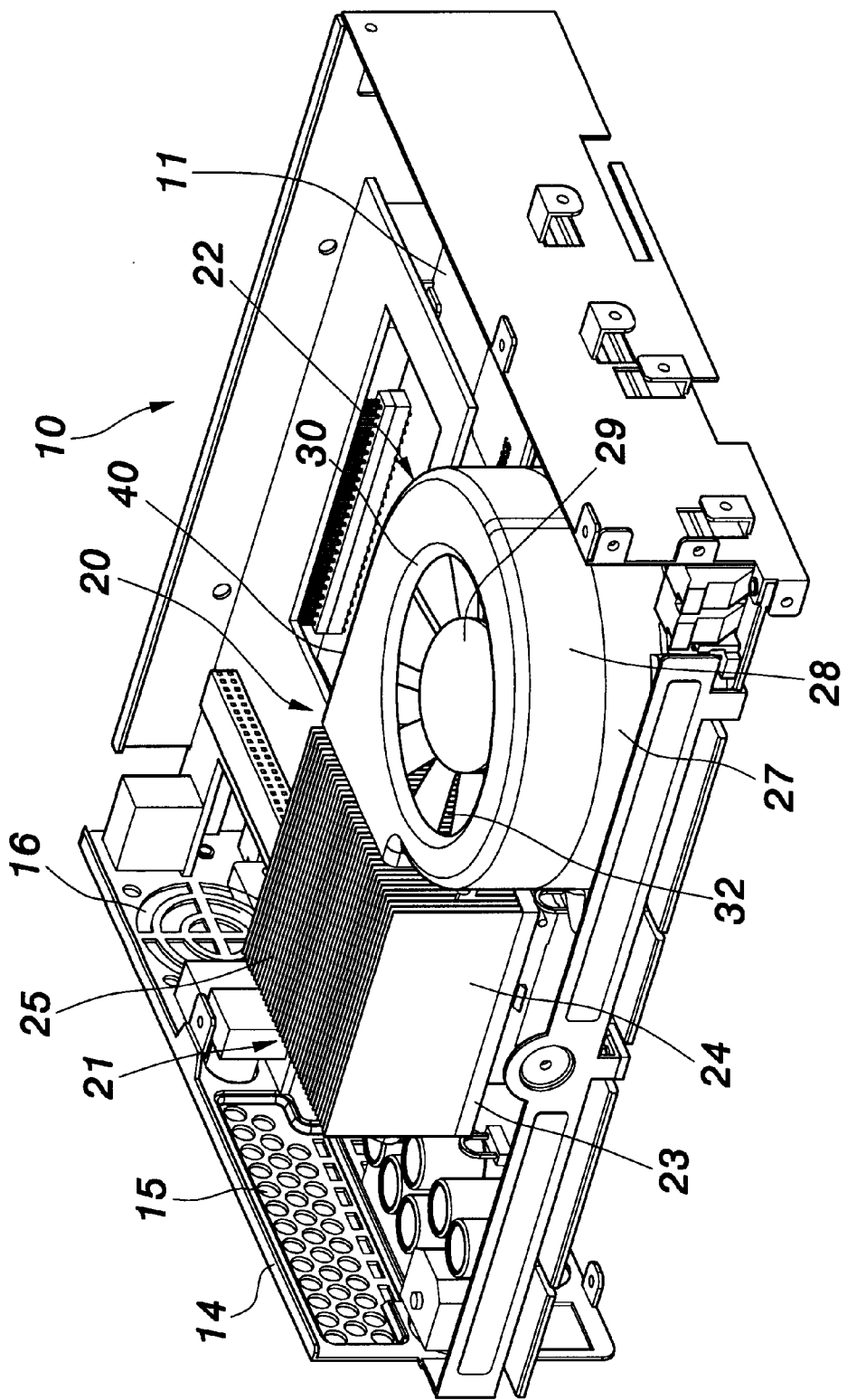
FIG. 4 is another perspective view of the computer heat dissipating structure of the invention.
Figure 5:
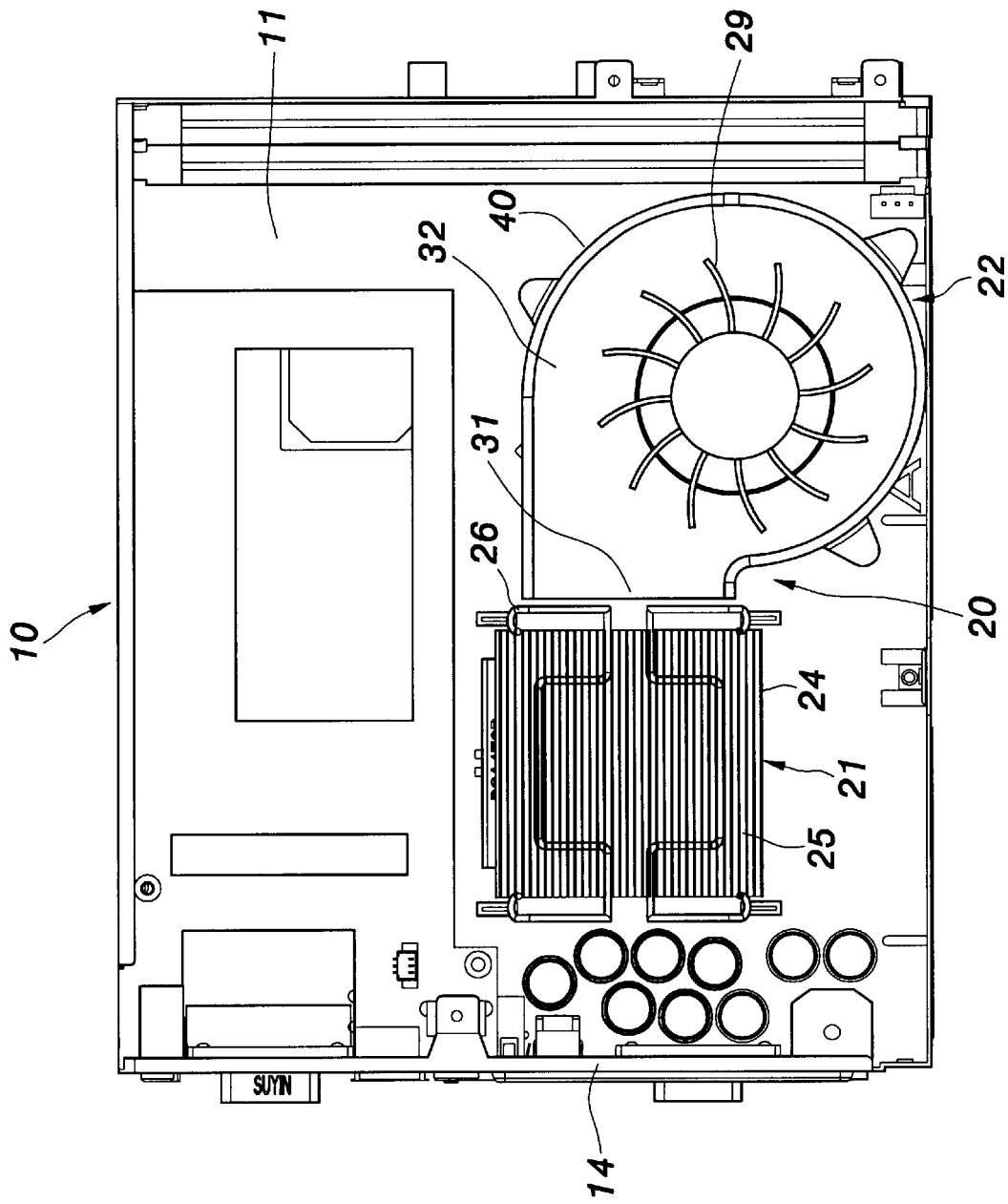
FIG. 5 is a top view of a computer heat dissipating structure according to an embodiment of the invention.

Reference now is made to FIG. 3 through FIG. 4 to describe a computer heat dissipating structure according to an embodiment of the invention. As illustrated, the invention provides a computer heat dissipating structure 20 that is mounted over a computer main board 11, inside a computer principal unit 10, to dissipate the heat irradiated from at least two heat sources 12, 13. The principal heat source 12 is, for example, a central processor unit (CPU). The secondary heat source 13 is, for example, a "north bridge" chipset. The secondary heat source 13 produces an amount of heat that is less than that of the principal heat source 12.

The computer heat dissipating structure 20 comprises a heat sink 21 and a fan 22. The heat sink 21 is made of, for example, aluminum formed by aluminum extrusion, aluminum pouring molding, or aluminum folding. Not limited to aluminum material, the heat sink 21 may also include copper or other materials having good thermal conduction characteristics. The heat sink 21 has a body 23 to which are connected a plurality of fins 24. The fins 24 are spaced apart from one another via airflow passageways 25. A bottom surface of the body 23 is mounted on the principal heat source 12. The heat sink 21 is securely attached to the principal heat source 12 via a fastening element 26.

The fan 22 is placed at one lateral side of the heat sink 21. The fan 22 comprises lower and upper casing bodies 27, 28 and a rotor 29. The lower casing body 27 is made of a material having good thermal conduction characteristics such as copper or aluminum. The upper casing body 28 may be made of, but is not limited to, metallic or plastics materials. The upper casing body 28 is mounted and securely fastened on the lower casing body 27 via snap fitting or screw assembly to form an outer casing 40 that has a generally cylindrical shape extending, at one lateral side (i.e. one lateral side of the upper and lower casing bodies), into an airflow outlet 31. An airflow inlet 30 is further formed through the top of the outer casing 40 (i.e. top of the upper casing body 28). The outer casing 40 defines an inner receiving chamber 32 that communicates with the airflow inlet 30 and the airflow outlet 31. The lower casing body 27 is securely attached to the computer main board 11 with a lower surface placed on the secondary heat source 13, the airflow outlet 31 connecting the heat sink 21.

The rotor 29 is pivotally mounted in the chamber 32 of the outer casing 40. The rotor 29 is further connected to a driving motor (not shown). When the rotor 29 is driven in rotation, airflow penetrates the fan 22 through the airflow inlet 30 and exits through the airflow outlet 31, which thereby forms a lateral blow on the heat sink 21.

The computer heat dissipating structure as described above is mounted within the computer principal unit 10, using a separate mount of the heat sink 21 on the principal heat source 12 and the fan 22 on the secondary heat source 13. The heat produced by the secondary heat source 13, of relatively lesser amount, is transmitted to the lower casing body 27 of the overlying fan 22. Via rotation of the rotor 29, cooling airflow, penetrating the fan 22 through the airflow inlet 30 and exiting through the airflow outlet 31, dissipates the heat produced by secondary heat source 13.

The heat produced by the principal heat source (typically a CPU) is transmitted and dissipated through the heat sink 21. The fins 24 increase the heat dissipating surface area of the heat sink 21, which therefore improves its thermal dissipation. The performance of the heat convection through the heat sink 21 and the heat dissipation of the principal heat source 12 are further improved via the airflow delivered at the airflow outlet 31 of the fan 22, directed to the heat sink 21. and the principal heat source 12. The airflow delivered by the fan 22 laterally passes along the passageways 25 and exits the principal unit 10 through air exit grooves 15 formed through the outer casing 14 of the principal unit 10. The grooves 15 may have any adequate shapes.

The casing 14 of the principal unit 10 may further include a plurality of air passage grooves 16 to facilitate the entry of external air. The grooves 16 may have any adequate shapes, and another fan (not shown) may be further mounted adjacent to the grooves 16 to promote the entry of external air and increase the airflow within the principal unit 10.

Via a lateral blow that produces a relatively low air pressure, the fan 22, the having the lower casing body 27 provided with heat dissipating characteristics, exhibits an improved heat dissipation performance. By separately mounting the heat dissipating structure on the two heat sources 12, 13, the heat dissipating structure of the invention has a simpler structure that is more economical and does not increase the occupation space.

Furthermore, the fan 22 is mounted at one lateral side of the heat sink 21. The heat dissipating structure of the invention therefore has a reduced height, and is more particularly adapted for computer having a limited height.

Moreover, the invention produces an incoming cooling airflow through the grooves 16, and further effectively conducts the hot air out of the computer principal unit through air exit grooves of a lateral side of the principal unit. As a result, the air circulation inside the computer principal unit is improved, which promotes the heat dissipation.

As described, the invention therefore represents an improvement compared to the conventional heat dissipating structure that uses a downward blow type fan, producing a relatively higher air pressure, which does not provide an effective thermal dissipation and is further deficient to dissipate the heat produced by more than one single heat source.

Those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A computer heat dissipating structure, mounted over a computer main board within a computer principal unit to dissipate the heat produced by a principal heat source and a secondary heat source, the computer heat dissipating structure comprising:

a heat sink, mounted on the principal heat source; and a fan, mounted at a lateral side of the heat sink, the fan having an outer casing that has a lower casing body made of a material having good thermal conduction characteristics, the outer casing further including an airflow inlet and an airflow outlet that is connected to the heat sink, the lower casing body being placed on the secondary heat source.

2. The structure of claim 1, wherein a casing of the computer principal unit further includes at least an air passage groove.

3. The structure of claim 2, wherein an airflow inlet fan is mounted proximate to the air passage groove to produce an incoming cooling airflow from outside.

4. The structure of claim 1, wherein the principal heat source is a central processor unit.

5. The structure of claim 1, wherein the secondary heat source is a north bridge chipset.

6. The structure of claim 1, wherein the heat sink comprises a body connected to a plurality of fins, and a plurality of airflows respectively formed between the fins thereof.

7. The structure of claim 1, wherein the heat sink is securely attached on the principal heat source via a fastening element.

8. The structure of claim 1, wherein the outer casing of the fan further includes an upper casing body that is assembled with the lower casing body, the airflow inlet and the airflow outlet are respectively located on a top and at a side of the outer casing of the fan, the outer casing having an inner receiving chamber that communicates with the airflow inlet and the airflow outlet and a rotor is mounted inside of the outer casing.

9. The structure of claim 8, wherein the airflow inlet is located on a top of the upper casing body.

10. The structure of claim 8, wherein the airflow outlet is located at a lateral side of the upper and lower casing bodies.

\* \* \* \* \*